United States Patent
Lee (10) Patent No.: US 7,250,894 B2
(45) Date of Patent: Jul. 31, 2007

(54) MATCHING CIRCUIT FOR TWO-CHANNEL ANALOG TO DIGITAL CONVERTERS

(75) Inventor: Woo Yol Lee, Seoul (KR)

(73) Assignee: LG Electronics Inc., Seoul (KR)

( * ) Notice: Subject to any disclaimer, the term of this patent is extended or adjusted under 35 U.S.C. 154(b) by 0 days.

(21) Appl. No.: 11/373,402

(22) Filed: Mar. 10, 2006

(65) Prior Publication Data

US 2006/0202880 A1    Sep. 14, 2006

(30) Foreign Application Priority Data

Mar. 11, 2005   (KR)  ................... 10-2005-0020703

(51) Int. Cl.
*H03M 1/12*    (2006.01)
(52) U.S. Cl. ..................... 341/155; 341/161
(58) Field of Classification Search ......... 341/130–160
See application file for complete search history.

(56) References Cited

U.S. PATENT DOCUMENTS

| | | | |
|---|---|---|---|
| 5,099,239 A * | 3/1992 | Bruce et al. ................ | 341/155 |
| 5,140,327 A * | 8/1992 | Bruce et al. ................ | 341/172 |
| 5,629,700 A * | 5/1997 | Kumamoto et al. ........ | 341/161 |
| 5,777,568 A * | 7/1998 | Inoue ......................... | 341/138 |
| 6,225,934 B1 * | 5/2001 | Ohashi et al. .............. | 341/155 |
| 7,106,231 B2 * | 9/2006 | Smith et al. ................ | 341/120 |

\* cited by examiner

*Primary Examiner*—Lam T. Mai
(74) *Attorney, Agent, or Firm*—Lee, Hong, Degerman, Kang & Schmadeka (57) ABSTRACT

A matching circuit for two-channel Analog to Digital Converters (ADCs) is disclosed in which two ADCs convert analog signals of two channels to digital signals with the same operational characteristics. A bias voltage supplier operates in such a way that analog signals of first and second channels are each converted to digital signals by first and second ADCs, a bias voltage supplier generates a DC bias voltage to set up DC levels of the analog signals of the first and second channels, and a reference voltage supplier generates a reference voltage and supplies it to the first and second ADCs. Therefore, the first and second ADCs convert the analog signals to digital signals with the same operational characteristics.

12 Claims, 5 Drawing Sheets

FIG. 1

PRIOR ART

MATCHING CIRCUIT FOR TWO-CHANNEL ANALOG TO DIGITAL CONVERTERS

CROSS-REFERENCE TO RELATED APPLICATIONS

This application claims priority under 35 U.S.C. § 119 to Korean Patent Application No.10-2005-0020703, filed on Mar. 11, 2005, the entirety of which is hereby incorporated by reference.

BACKGROUND

This description relates to a matching circuit for two-channel Analog to Digital Converters (ADCs) by which operational characteristics of two ADCs for respectively converting two-channel analog signals to digital signals can be matched.

More particularly, this description relates to a matching circuit for two-channel ADCs by which operation characteristics of two ADCs for converting an analog signal of I (In-phase) channel and an analog signal of Q (Quadrature-phase) channel to respective digital signals in satellite Digital Multimedia Broadcasting (DMB) signals received by a satellite DMB receiver can be mutually and accurately matched.

Recently, concomitant with development of digital broadcasting techniques and implementation of satellite digital multimedia broadcasting, demand on satellite DMB receivers capable of receiving and viewing DMB signals has continuously increased.

The satellite DMB signals received by the satellite DMB receivers include analog signals of two channels. In other words, the satellite DMB receivers receive an analog signal of I (In-phase) channel and an analog signal of Q (Quadrature-channel). The satellite DMB receiver converts the two channels of analog signals to respective digital signals via ADCs and displays them on a screen. The characteristics of converting the analog signals of two channels to respective digital signals by the satellite DMB receivers are directly reflected on those of the picture quality on the screen.

Chips inherently disposed in the satellite DMB receivers are mounted with two ADCs for converting the analog signals of two channels to respective digital signals. In addition, the analog signals should be set up with a predetermined level of direct current (DC) bias voltage in order for said two ADCs to convert the analog signals of two channels to respective digital signals. Furthermore, a maximum reference voltage and a minimum reference voltage each of a predetermined level should be supplied to allow the analog signals to be converted to digital signals within scopes of maximum reference voltage and minimum reference voltage.

There is no specification on the operational characteristics relative to two ADCs disposed in the satellite DMB receivers. Typically, satellite DMB receiver manufacturers provide two DC bias voltage suppliers to generate a DC bias voltage in order to set up a DC bias voltage of a predetermined level, and supply the generated DC bias voltage to analog signals of two channels for combination thereof. The manufacturers also prepare two reference voltage generators for generating a maximum reference voltage and a minimum reference voltage, and the maximum reference voltage and the minimum reference voltage generated by said two reference voltage generators are supplied to two ADCs.

Adjustment is implemented in which levels of the DC bias voltage generated by said two bias voltage suppliers and levels of the maximum reference voltage and the minimum reference voltage generated by said two reference voltage generators are matched.

However, even if the DC bias voltage outputted by the two bias voltage suppliers and the maximum reference voltage and the minimum reference voltage outputted by the two reference voltage generators are adjusted to match each other, chances are that the DC bias voltage and the maximum and minimum reference voltages do not match as time goes by.

If the levels of the DC bias voltage and the levels of maximum and minimum reference voltages supplied to said two ADCs change and do not match therebetween, gains of said two ADCs come to differ, and difference of gains between the said two ADCs bring about differentiation of values in which analog signals of two channels each having the same level are converted to digital signals, thereby resulting in degraded picture quality.

Therefore, it is preferred that two ADCs convert two analog signals to respective digital signals with the same operational characteristics therebetween.

SUMMARY

One object is to provide a matching circuit for two-channel ADCs by which operational characteristics of two ADCs are accurately matched to allow analog signals of two channels to be accurately converted to respective digital signals.

Another object is to provide a matching circuit for two-channel ADCs by which analog signals of two channels share a DC bias voltage and a reference voltage for converting the analog signals to digital signals so that operational characteristics of said two ADCs can be accurately matched.

In one general aspect, a matching circuit for two-channel ADCs operates in such a manner that one bias voltage supplier supplies a DC bias voltage to first and second ADCs to set up DC levels of analog signals for first and second channels, and one reference voltage supplier generates a reference voltage to supply it to first and second ADCS.

In another general aspect, a matching circuit for two-channel ADCs comprises: first and second ADCs converting analog signals of first and second channels to respective digital signals; a bias voltage supplier generating a DC bias voltage to set up DC levels for the first and second channels; and a reference voltage generator generating a reference voltage for supply to the first and second ADCs.

DETAILED DESCRIPTION

Figure 1:
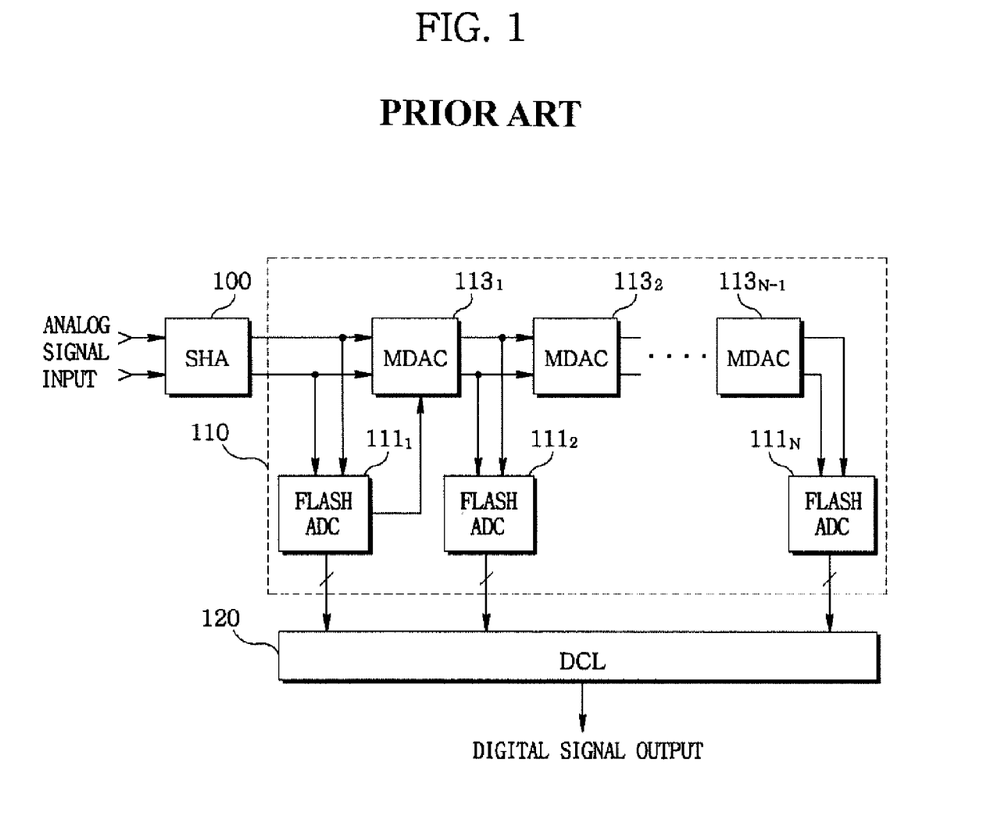
FIG. 1 is a block diagram illustrating the configuration of an ADC according to the prior art.

FIG. 1 is a block diagram illustrating the configuration of an ADC according to the prior art, where reference numeral 100 is a Sampling and Holding Amplifier (SHA). The SHA 100 samples and holds an analog signal received from outside in response to a clock signal of a predetermined frequency, and amplifies and outputs the held analog signal. For example, the SHA 100 receives an analog signal of approximately 12 MHz bandwidth and samples and holds the analog signal in response to a unit time, e.g., a clock signal of 32 MHz, and amplifies and outputs the held analog signal.

The analog signal outputted by the SHA 100 is converted to a digital signal by a pipeline ADC 110.

The pipeline ADC 110 includes a plurality of flash ADCs ($111_1, 111_2, \ldots, 111_N$), and a plurality of MDACs ($113_1, 113_2, \ldots, 113_{N-1}$). The plurality of flash ADCs ($111_1, 111_2, \ldots, 111_N$) disposed at the pipeline ADC 110 converts the analog signal of a predetermined level to a digital signal of a predetermined bit based on a maximum reference voltage and a minimum reference voltage in the analog signals outputted from the SHA 100 and the plurality of MDACs ($113_1, 113_2, \ldots, 113_{N-1}$).

Furthermore, each flash ADC ($111_1, 111_2, \ldots, 111_{N-1}$) informs of the plurality of MDACs ($113_1, 113_2, \ldots, 113_{N-1}$) a scope of a predetermined level of the analog signal converted to the digital signal.

Each MDAC ($113_1, 113_2, \ldots, 113_{N-1}$) deducts from each signal outputted from the SHA 100 and the plurality of flash ADCs ($111_1, 111_2, \ldots, 111_{N-1}$) a predetermined level in which the plurality of flash ADCs ($111_1, 111_2, \ldots, 111_{N-1}$) are converted to the digital signals, and levels remaining after the deduction are expanded to the scope of the maximum reference voltage and the minimum reference voltage and outputted to the plurality of flash ADCs ($111_2, 111_3, \ldots, 111_N$).

The digital signals respectively outputted from the plurality of flash ADCs ($111_1, 111_2, \ldots, 111_N$) are inputted to a DCL (Digital Correction Logic.120), where the DCL corrects errors of the digital signals inputted from the plurality of flash ADCs ($111_1, 111_2, \ldots, 111_N$) and outputs the digital signal digitally converted from the analog signal.

In converting the analog signal to the digital signal by the ADC in FIG. 1, the ADC should set up a Direct Current (DC) bias voltage of a predetermined level at the analog signal inputted from the SHA 100, and a maximum reference voltage and a minimum reference voltage should be set up at the plurality of flash ADCs 111 and MDACs 113.

Meanwhile, the satellite DMB receiver employs two ADCs as shown in FIG. 1 in order to convert the received analog signals of two channels to digital signals. The operational characteristics of the two ADCs are directly related to the characteristics of the picture quality such that it is preferred to see it that operational characteristics of said two ADCs are identical.

In doing so, the DC bias voltage set up at the analog signals of two channels is shared, and the plurality of flash ADCs 111 and the plurality of MDACs 113 of the pipeline ADC 110 are made to share the reference voltages.

Figure 2:
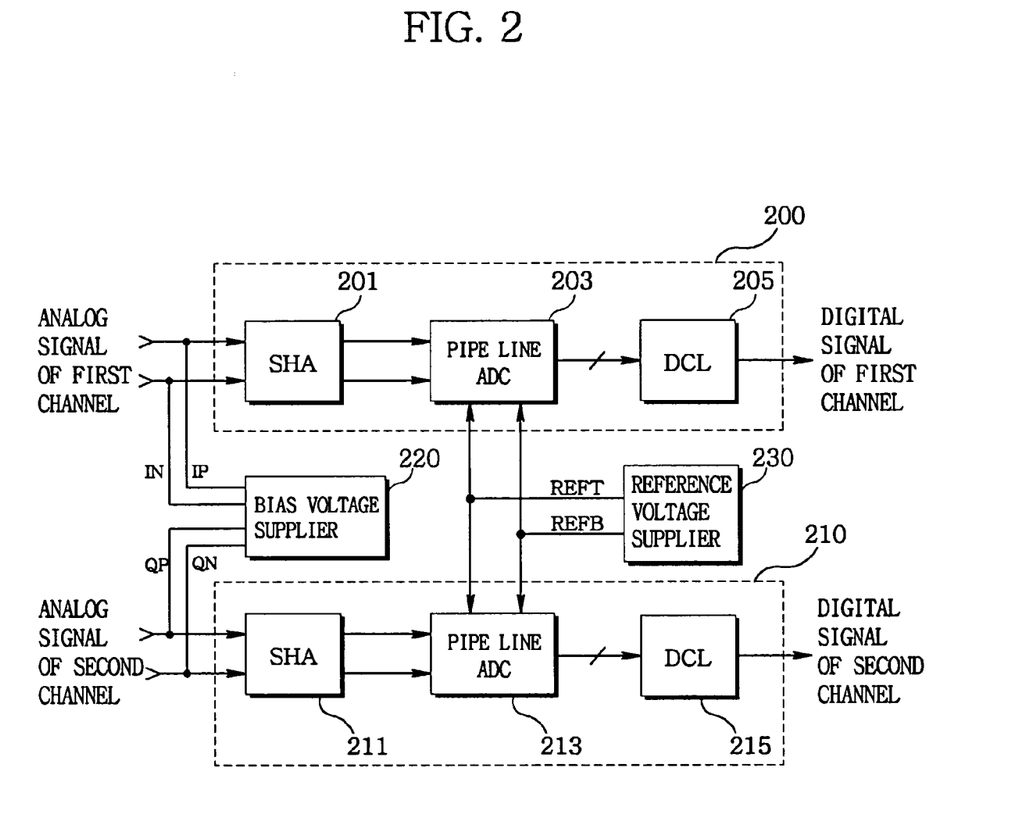
FIG. 2 is a block diagram illustrating the configuration of a matching circuit of two-channel ADC according to the present invention.

FIG. 2 is a block diagram illustrating the configuration of a matching circuit of two-channel ADC according to the present invention, where reference numerals 200 and 210 respectively denote a first ADC and a second ADC for converting respective analog signals of two channels to digital signals. For example, the first ADC 200 converts an analog signal of I channel received by a satellite DMB receiver to a digital signal, and the second ADC 210 converts an analog signal of Q channel to a digital signal.

The first and second ADCs 200 and 210 are respectively disposed with SHAs 201 and 211, pipeline ADCs 203 and 213, and DCLs 205 and 215.

The SHAs 201 and 211 sample and hold analog signals received from outside in response to a clock signal of a predetermined frequency, and amplify and output the held analog signals. For example, the SHAs 201 and 211 receive analog signals of I channel and Q channel received by the satellite DMB, and sample and hold the analog signals in response to a clock signal of a predetermined frequency, and amplify and output the held analog signal.

The analog signals outputted by the SHAs 201 and 211 are converted to digital signals by the pipeline ADCs 203 and 213.

The pipeline ADCs 203 and 213 include a plurality of flash ADCs and a plurality of MDACs as illustrated in FIG. 1. The digital signals outputted by the plurality of flash ADCs disposed at the pipeline ADCS 203 and 213 are corrected of errors thereof and outputted.

Reference numeral 220 denotes a bias voltage supplier and generates DC bias voltages (IP, QP) (IN, QN) of same level. The DC bias voltages (IP, QP) (IN, QN) thus generated are respectively combined with two channel analog signals inputted from the SHAs 200 and 210.

Reference numeral 230 represents a reference voltage supplier. The reference voltage supplier 230 generates a maximum reference voltage (REFT) and a minimum reference voltage (REFB), and the generated maximum reference voltage (REFT) and the minimum reference voltage (REFB) are supplied to the plurality of flash ADCs and the MDACs disposed at the pipeline ADCs 203 and 213.

Figure 3:
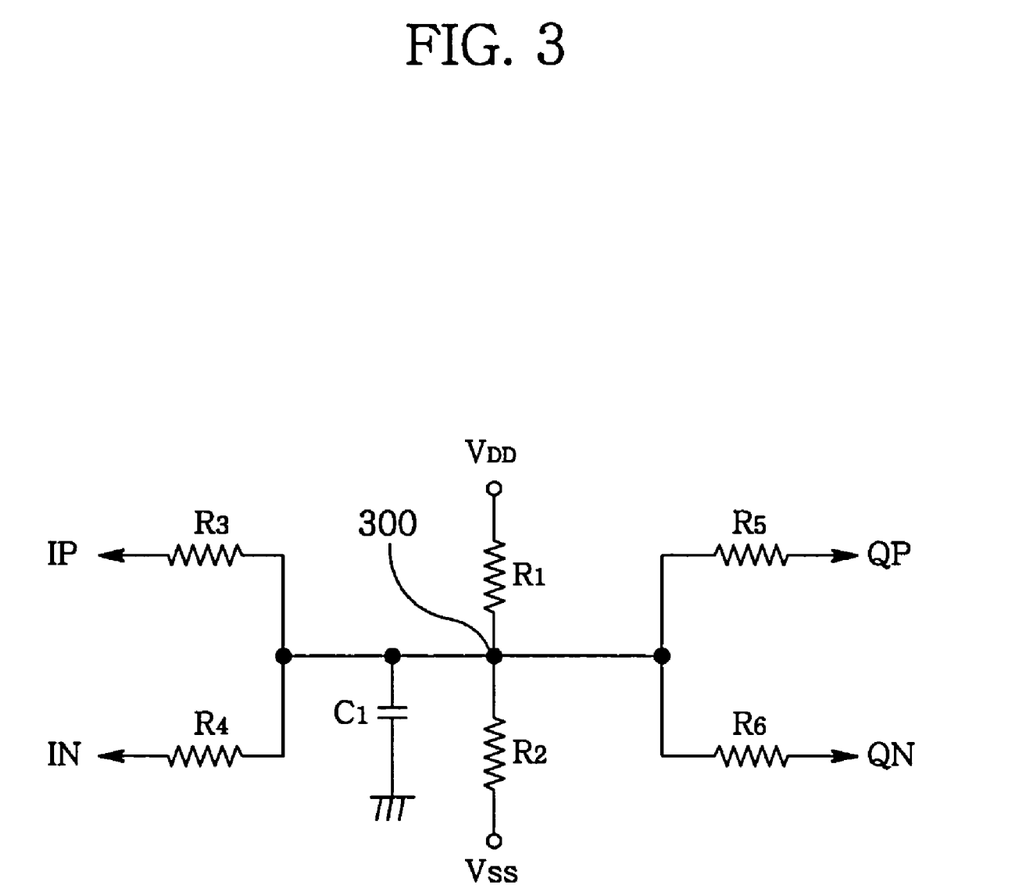
FIG. 3 is a detailed circuit diagram illustrating the configuration of a DC bias supplier of FIG. 2.

Referring to FIG. 3, the bias voltage supplier 220 is such that that between first and second power source terminals ($V_{DD}$) (Vss), first and second resistors ($R_1$) ($R_2$) are connected in series, and a condenser ($C_1$) for stabilizing the voltage is connected to a contact point 300 between the first and second resistors ($R_1$) ($R_2$).

A voltage at the contact point 300 between the first and second resistors ($R_1$) ($R_2$) is supplied as a DC bias voltage to an analog signal inputted to the SHA 201 via third and fourth resistors ($R_3$) ($R_4$). Furthermore, a voltage at the contact point 300 between the first and second resistors ($R_1$) ($R_2$) is supplied as a DC bias voltage to an analog signal inputted to the SHA 211 via fifth and sixth resistors ($R_5$) ($R_6$).

Figure 4:
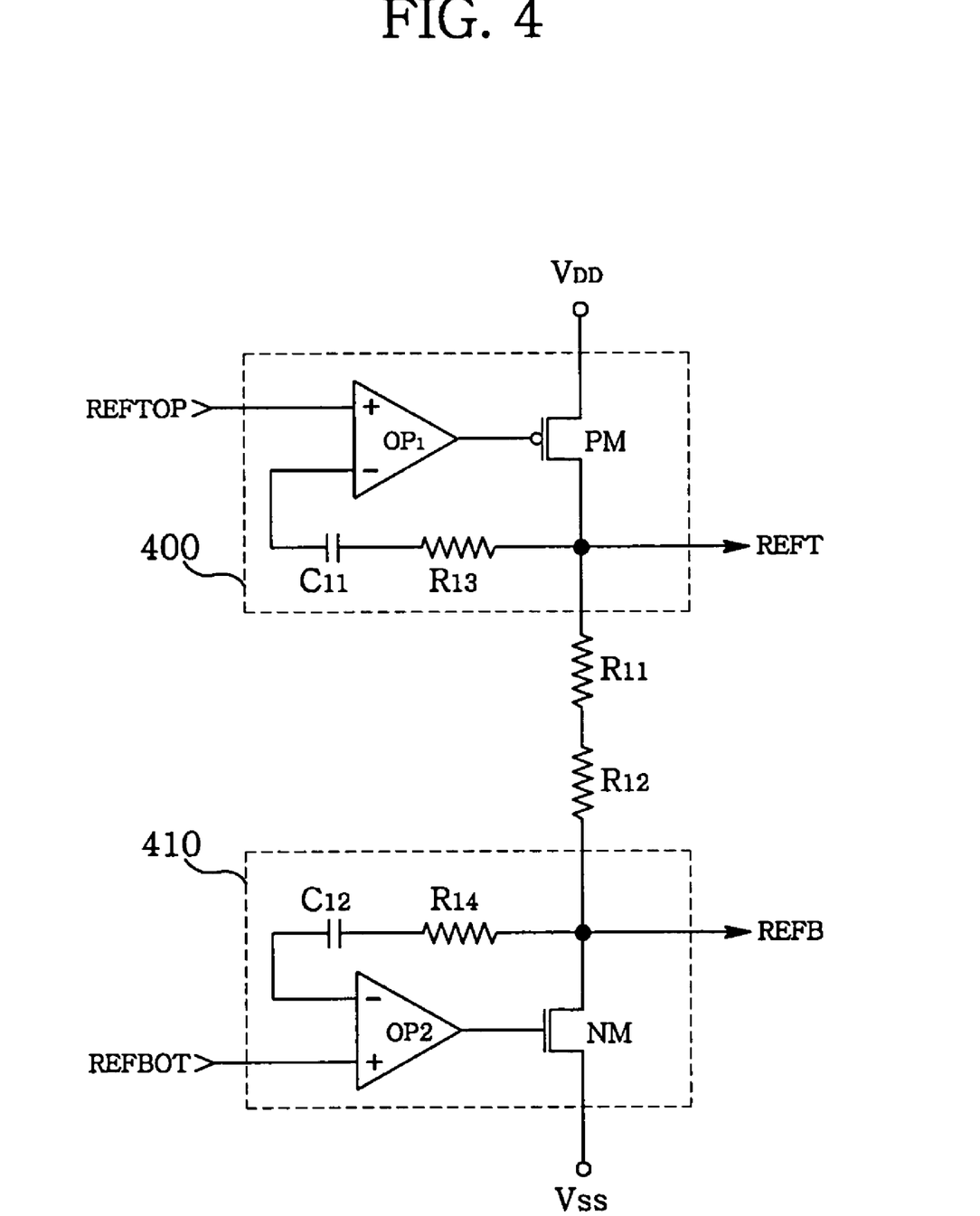
FIG. 4 is a detailed circuit diagram illustrating the configuration of a reference voltage supplier of FIG. 2.

The reference voltage supplier 230 includes a first amplifier 400, a second amplifier 410 and a plurality of resistors ($R_{11}$) ($R_{12}$) as illustrated in FIG. 4.

The first amplifier 400 amplifies a first reference voltage (REFTOP) to generate a maximum reference voltage (REFT). The second amplifier 40 amplifies an inputted second reference voltage (REFBOT) to generate a minimum reference voltage (REFB). The plurality of resistors ($R_{11}$) ($R_{12}$) are connected in series between output terminals of the first and second amplifiers 400 and 410 such that a maximum reference voltage (REFT) and a minimum reference voltage (REFB) are generated to have a level of voltage applied to the first and second power source terminals ($V_{DD}$) (Vss).

The first amplifier 400 is connected in such a manner that the first reference voltage (REFTOP) is applied to a non-inverse terminal (+) of an operational amplifier ($OP_1$). A PMOS (hereinafter the MOS transistor is simply referred to as "MOST" and the P-channel MOS transistor as "PMOST". PM) is connected to a terminal from which the first power source terminal ($V_{DD}$) and the maximum reference voltage (REFT) are outputted, and a gate of the PMOST (PM) is connected to an output terminal of the operational amplifier (OP$_1$) Furthermore, a terminal from which the maximum reference voltage (REFT) is outputted is connected to a reverse input terminal (−) of the operational amplifier (OP$_1$) via a resistor (R$_{13}$) and a condenser (C$_{11}$).

The second amplifier 410 has a structure symmetrical with that of the first amplifier 400, where the minimum reference voltage (REFBOT) is connected to a non-inverse terminal (+) of an operational amplifier (OP$_2$) An N-channel MOS transistor (hereinafter the MOS transistor is simply referred to as "MOST" and the N-channel MOS transistor as "NMOST". NM) is connected between a terminal from which the minimum reference voltage (REFB) is outputted and the second power source terminal (Vss), and a gate of the NMOST (NM) is connected to an output terminal of the operational amplifier (OP$_2$). Furthermore, a terminal from which the minimum reference voltage (REFB) is outputted is connected to a reverse input terminal (−) of the operational amplifier (OP$_2$) via a resistor (R$_{14}$) and a condenser (C$_{12}$).

Under a state where the first and second power source terminals (V$_{DD}$) (Vss) are applied with an operational power source, the bias voltage supplier 220 divides the voltage of the first and second power source terminals (V$_{DD}$) (Vss) into first and second resistors (R$_1$) (R$_2$), and a center voltage is generated from the contact point 300 between the first and second resistors (R$_1$) (R$_2$) which is a voltage supplied to the first and second power source terminals (V$_{DD}$) (Vss). The generated center voltage is stabilized by the condenser (C$_1$).

The center voltage of the stabilized contact point 300 is supplied to an analog signal of a first channel as DC bias voltages (IP, IN) via the third and fourth resistors (R$_3$) (R$_4$). The center voltage is also supplied to an analog signal of a second channel as DC bias voltages (QP, QN) via the fifth and sixth resistors (R$_5$) (R$_6$).

In the present invention, the first and the second resistors (R$_1$) (R$_2$) are set up as having a same resistance value, and the third through sixth resistors (R$_3$–R$_6$) are also set up as having the same resistance value.

Henceforth, the center voltage of the contact point 300 between the first and second resistors (R$_1$) (R$_2$) stabilized by the condenser (C$_1$) is supplied to the analog signals of the first and second channels via the third through sixth resistors (R$_3$–R$_6$) as DC bias voltages (IP, IN) (QP, QN). Accordingly, the DC bias voltages (IP, IN) (QP, QN) of the analog signals of the first and second channels become of the same levels.

Furthermore, the reference voltage supplier 230 operates in such a fashion that the operational amplifiers (OP$_1$) (OP$_2$) of the first and second amplifiers respectively amplify the first and second reference voltages (REFTOP) (REFB) such that the PMOST (PM) and the NMOST (NM) are conducted in response to the output signals from the operational amplifiers (OP$_1$) (OP$_2$).

Thereafter, a current flows from the first power source terminal terminals (V$_{DD}$) to the second power source terminal (Vss) via the PMOST (PM), resistors (R$_{11}$, R$_{12}$) and the NMOST (NM) to thereby output the maximum reference voltage (REFT) and the minimum reference voltage (REFB) each of a predetermined level.

The maximum reference voltage (REFT) and the minimum reference voltage (REFB) thus outputted are respectively feedback to the reverse input terminals (−) of the operational amplifiers (OP$_1$) (OP$_2$) sequentially via resistors (R$_{13}$) (R$_{14}$) of the first and second amplifiers 400 and 410 and condensers (C$_{11}$) (C$_{12}$).

Consequently, the first and second amplifiers 400 and 410 come to output stable voltages each of a predetermined level, and the PMOST (PM), resistors (R$_{11}$, R$_{12}$) and the NMOST (NM) stably operates to thereby enable to output stable maximum reference voltage (REFT) and minimum reference voltage (REFB) each of a predetermined level.

The maximum reference voltage (REFT) and the minimum reference voltage (REFB) each of the predetermined level outputted by the voltage supplier 230 is inputted to the pipeline ADCs 203 and 213, and are used as reference voltages for converting the analog signals of the first and second channels sampled and held by the SHAs 201 and 211 to digital signals.

In the present invention, the reference voltage supplier 230 generates the maximum reference voltage (REFT) and the minimum reference voltage (REFB) each of a predetermined level to allow the pipeline ADCs 203 and 213 to share, such that gains of the pipeline ADCs 203 and 213 are equalized, whereby the values of the digital signals outputted by the ADCs 203 and 213 become identical relative to the analog signals of two channels of the same level.

Figure 5:
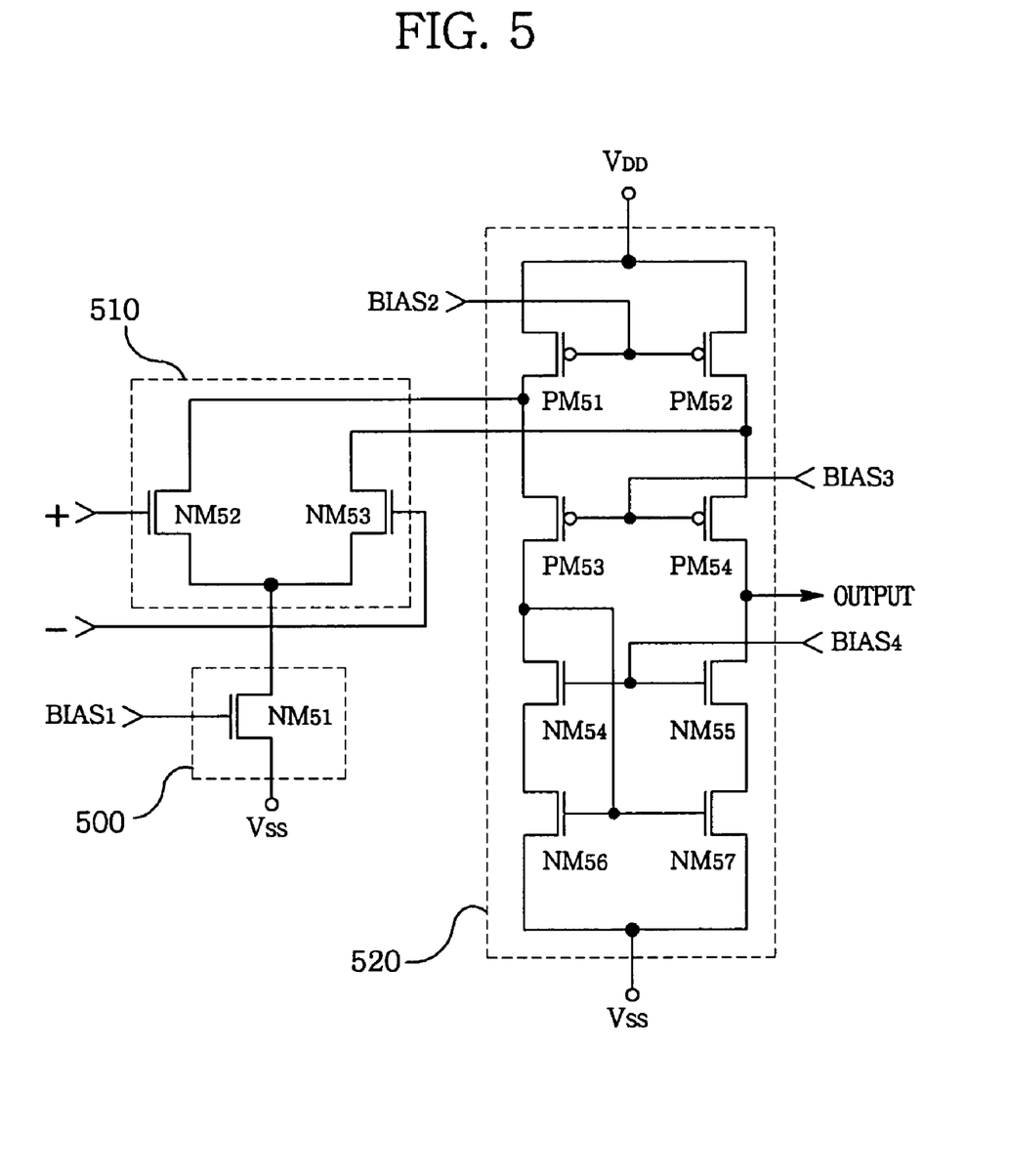
FIG. 5 is a detailed circuit diagram illustrating an inner configuration of operational amplifiers of FIG. 4.

FIG. 5 is a detailed circuit diagram illustrating an inner configuration of operational amplifiers (OP$_1$) (OP$_2$) used for the reference voltage supplier of the present invention.

Referring to FIG. 5, the operational amplifiers (OP$_1$) (OP$_2$) include a constant current source 500, a differential amplifier 510 and a folded cascade amplifier 520.

The constant current source 500 operates in such a way that an NMOST (NM$_{51}$) is turned on in response to a first bias voltage (BIAS$_1$) to prompt a current to flow from the differential amplifier 510 to the power source terminal (Vss).

The differential amplifier 510 differentially amplifies input signals of the reverse input terminal (−) and the non-inverse input terminal (+) by way of NMOSTs (NM$_{52}$) (NM$_{53}$) while the constant current source 500 flows the current.

The folded cascade amplifier 520 is such that between the power source terminals (V$_{DD}$) (Vss), PMOSTs (PM$_{51}$, PM$_{53}$) and NMOSTs (NM$_{54}$, NM$_{56}$), and PMOSTs (PM$_{52}$, PM$_{54}$) and NMOSTs (NM$_{55}$, NM$_{57}$) are respectively connected in series. Gates of the PMOSTs (PM$_{51}$, PM$_{52}$) are supplied with a second bias voltage (BIAS$_2$). Gates of the PMOSTs (PM$_{53}$, PM$_{54}$) are supplied with a third bias voltage (BIAS$_3$). Gates of NMOSTs (NM$_{54}$, NM$_{55}$) are supplied with a fourth bias voltage (BIAS$_4$).

A connection point between the PMOST (PM$_{53}$) and the NMOST (NM$_{54}$) is connected to gates of the NMOSTs (NM$_{56}$, NM$_{57}$). A connection point between the PMOSTs (PM$_{51}$, PM$_{53}$), and a connection point between the PMOSTs (PM$_{52}$, PM$_{54}$) are respectively connected with an output terminal of the differential amplifier 510. An output signal is outputted from a connection point between the PMOST (PM$_{54}$) and the NMOST (NM$_{55}$).

The first and second operational amplifiers (OP$_1$) (OP$_2$) thus constructed operate in such a manner that a predetermined level of constant current flows to the NMOST (NM$_{51}$) of the constant current source 500 responsive to the first bias voltage (BIAS$_1$) while operational power source is applied to the power source terminals (V$_{DD}$) (Vss), thereby prompting a constant current to flow to the differential amplifier 510.

Under this state, a predetermined level of signal is inputted to the reverse input terminal (−) and the non-inverse terminal (+). Then, the differential amplifier 510 differentially amplifies the signal inputted into the reverse input terminal (−) and the non-inverse terminal (+), and the output signal from the differential amplifier 510 is inputted into the folded cascode amplifier 520, cascode-amplified and outputted.

The first and second operational amplifiers (OP$_1$) (OP$_2$) differentially amplify the signals of the reverse input terminal (−) and a non-inverse terminal (+) by way of the differential amplifier 510, and the output signal of the differential amplifier 510 is again amplified and outputted by the folded cascade amplifier 520, such that stable maximum reference voltage (R$_{TOP}$) and the minimum reference voltage (R$_{bot}$) can be supplied to the plurality of flash ADCs and the plurality of MDACs with high gain and at a high speed disposed at the pipeline ADCs 203 and 213

As apparent from the foregoing, a DC bias voltage generated by one bias voltage supplier is shared by first and second ADCs in converting analog signals of two channels to digital signals. Furthermore, maximum and minimum reference voltages generated by one reference voltage supplier is shared by the first and second ADCS.

Consequently, converted gains of said two ADCs are identical, and analog signals of two channels are accurately converted to digital signals of the same gains to thereby enable to provide a good picture quality to a screen.

While the above description has pointed out novel features of the invention as applied to various embodiments, the skilled person will understand that various omissions, substitutions, and changes in the form and details of the device or process illustrated may be made without departing from the scope of the invention. Therefore, the scope of the invention is defined by the appended claims rather than by the foregoing description. All variations coming within the meaning and range of equivalency of the claims are embraced within their scope.

What is claimed is:

1. A matching circuit for two-channel Analog to Digital Converters (ADCs), the circuit comprising:
   first and second ADCs for converting analog signals input to a first channel and a second channel to digital signals;
   a bias voltage supplier generating a Direct Current (DC) voltage and setting up DC levels of the analog signals of the first and second channels; and
   a reference voltage generator generating a reference voltage and supplying the reference voltage to the first and second ADCs,
   wherein the analog signals of the first and second channels are the signals of I (In Phase) and Q (Quadrature Phase) channels received by a satellite Digital Multimedia Broadcasting (DMB) reciever.

2. The circuit as defined in claim 1, wherein each of the first and second ADCs comprises:
   a Sampling and Holding Amplifier (SHA) sampling and holding the DC levels of the analog signals;
   a pipeline ADC converting an output signal of the SHA to a digital signal; and
   a Digital Correction Logic (DCL) correcting errors of the digital signals output by the pipeline ADC.

3. The circuit as defined in claim 2, wherein the SHA amplifies and outputs the held analog signals to the pipeline ADC.

4. The circuit as defined in claim 2, wherein the pipeline ADC comprises:
   a plurality of Multiplying Digital to Analog Converters (MDACs) connected in series with each other and to an output terminal of the SHA, and deducting a level converted to a digital signal from the level of the input signal, and expanding the level remaining after the deduction to the scope of a maximum reference voltage and a minimum reference voltage; and
   a plurality of flash ADCs converting only the signal of a predetermined level to a digital signal of a predetermined bit from output signals of the SHA and the plurality of MDACs based on the maximum reference voltage and the minimum reference voltage, and outputting the level of the signal converted to the digital signal to the plurality of MDACs.

5. The circuit as defined in claim 1, wherein the bias voltage supplier comprises:
   first and second resistors connected in series between first and second power source terminals to divide the voltage between the first and second power source terminals; and
   a plurality of resistors supplying the voltage divided by the first and second resistors as a DC bias voltage to the analog signals input to the first and second channels.

6. The circuit as defined in claim 5, wherein the voltage divided by the first and second resistors is a center voltage of the voltages applied to the first and second power source terminals.

7. The circuit as defined in claim 5, wherein a grounding condenser is further disposed at a contact point between the first and second resistors for stabilizing the DC bias voltage.

8. The circuit as defined in claim 1, wherein the reference voltage supplier comprises:
   a first amplifier amplifying a first reference voltage and generating a maximum reference voltage;
   a second amplifier amplifying a second reference voltage and generating a minimum reference voltage; and
   resistors disposed at output terminals of the maximum reference voltage and the minimum reference voltage.

9. The circuit as defined in claim 8, wherein the first amplifier comprises:
   an operational amplifier for operationally amplifying the first reference voltage and a feedback signal;
   a PMOST (P-channel MOS Transistor) turned on in response to an output signal of the operational amplifier and in which a current of a predetermined level flows from a first power source terminal to an output terminal of the maximum reference voltage; and
   a resistor and a condenser feeding back the maximum reference voltage to the operational amplifier.

10. The circuit as defined in claim 9, wherein the operational amplifier comprises:
    a constant current source in which a constant current flows in response to a first bias voltage;
    a differential amplifier in which a constant current flows by way of the constant current source and differentially amplifying input signals of a reverse input terminal (−) and a non-inverse terminal (+); and
    a folded cascade amplifier cascade-amplifying an output signal of the differential amplifier.

11. The circuit as defined in claim 8, wherein the second amplifier comprises:
    an operational amplifier for operationally amplifying the second reference voltage and a feedback signal;
    an NMOST (N-channel MOS Transistor) turned on in response to an output signal of the operational amplifier and in which a current of a predetermined level flows from the second power source terminal to an output terminal of the minimum reference voltage; and
    a resistor and a condenser feeding back the minimum reference voltage to the operational amplifier.

12. The circuit as defined in claim 11, wherein the operational amplifier comprises:
    a constant current source in which a constant current flows in response to the first bias voltage;

a differential amplifier in which a constant current flows by way of the constant current source and differentially amplifying input signals of a reverse input terminal (−) and a non-inverse terminal (+); and a folded cascade amplifier cascade-amplifying an output signal of the differential amplifier.

* * * * *